United States Patent
Kim et al.

(10) Patent No.: US 11,641,715 B2
(45) Date of Patent: May 2, 2023

(54) PRINTED CIRCUIT BOARD

(71) Applicant: SAMSUNG ELECTRO-MECHANICS CO., LTD., Suwon-si (KR)

(72) Inventors: Eun Sun Kim, Suwon-si (KR); Jin Uk Lee, Suwon-si (KR); Young Hun You, Suwon-si (KR); Chi Seong Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/476,980

(22) Filed: Sep. 16, 2021

(65) Prior Publication Data

US 2022/0322533 A1 Oct. 6, 2022

(30) Foreign Application Priority Data

Mar. 31, 2021 (KR) .......................... 10-2021-0041856

(51) Int. Cl.
*H05K 1/18* (2006.01)
*H05K 1/11* (2006.01)
*H05K 3/46* (2006.01)

(52) U.S. Cl.
CPC ............. *H05K 1/183* (2013.01); *H05K 1/113* (2013.01); *H05K 3/4688* (2013.01); *H05K 3/4697* (2013.01); *H05K 2201/09827* (2013.01)

(58) Field of Classification Search
CPC ...... H05K 1/183; H05K 1/113; H05K 3/4688; H05K 3/4697; H05K 2201/09827

USPC ......................................................... 174/250
See application file for complete search history.

(56) References Cited

U.S. PATENT DOCUMENTS

| | | | |
|---|---|---|---|
| 2002/0008323 A1* | 1/2002 | Watanabe ......... | H01L 21/76807 257/E21.579 |
| 2008/0130122 A1* | 6/2008 | Egi ....................... | G02B 26/026 428/141 |
| 2010/0103634 A1* | 4/2010 | Funaya ................ | H01L 25/0657 174/262 |
| 2012/0217614 A1* | 8/2012 | Burgyan .................. | H01L 23/10 257/532 |
| 2015/0262927 A1* | 9/2015 | Kang ..................... | C25D 5/022 216/13 |
| 2022/0039261 A1 | 2/2022 | Hwang et al. | |

FOREIGN PATENT DOCUMENTS

| | | | | |
|---|---|---|---|---|
| JP | 2017-228724 A | | 12/2017 | |
| JP | 2019087722 A | * | 6/2019 | ............. H05K 1/185 |
| JP | 2019-197853 A | | 11/2019 | |
| KR | 10-2019-0052852 A | | 5/2019 | |
| KR | 10-2022-0015011 A | | 2/2022 | |

* cited by examiner

*Primary Examiner* — Andargie M Aychillhum
(74) *Attorney, Agent, or Firm* — Morgan, Lewis & Bockius LLP

(57) ABSTRACT

A printed circuit board includes a first insulating layer; a protective filler layer disposed on one surface of the first insulating layer; a first wiring layer disposed on the one surface of the first insulating layer and having a pad protruding with respect to the protective filler layer; a first via passing through the first insulating layer and contacting the pad; and a second insulating layer disposed on the first wiring layer and the protective filler layer, and having a cavity exposing the pad and at least a portion of the protective filler layer, respectively.

20 Claims, 8 Drawing Sheets

PRINTED CIRCUIT BOARD

CROSS-REFERENCE TO RELATED APPLICATION(S)

This application claims benefit of priority to Korean Patent Application No. 10-2021-0041856 filed on Mar. 31, 2021 in the Korean Intellectual Property Office, the disclosure of which is incorporated herein by reference in its entirety.

TECHNICAL FIELD

The present disclosure relates to a printed circuit board.

BACKGROUND

In order to respond to the recent trend for lightness, miniaturization, and the like, of mobile devices, the need to implement lightness, thinning, shortening, and miniaturization in printed circuit boards mounted thereon is also gradually increasing.

Meanwhile, as mobile devices are becoming lighter, thinner, shorter, and smaller, in response to technical demands, a technology in which electronic components such as ICs, active devices, passive devices, or the like are inserted into a board is required in terms of shortening a connection path between the electronic components and improving noise-related problems. In recent years, research into a technology for embedding components in a board using various methods has continued.

In particular, a board including a cavity is formed in order to insert various components into the board, and a technique using a blasting process or the like may be being performed to form the cavity.

SUMMARY

An aspect of the present disclosure is to provide a printed circuit board including a microcircuit and/or a micro via.

Another aspect of the present disclosure is to provide a printed circuit board having improved uniformity of a microcircuit.

According to an aspect of the present disclosure, a printed circuit board includes a first insulating layer; a protective filler layer disposed on one surface of the first insulating layer; a first wiring layer disposed on the one surface of the first insulating layer and having a pad protruding with respect to the protective filler layer; a first via passing through the first insulating layer and contacting the pad; and a second insulating layer disposed on the first wiring layer and the protective filler layer, and having a cavity exposing the pad and at least a portion of the protective filler layer, respectively.

According to an aspect of the present disclosure, a printed circuit board includes a first insulating layer; a protective filler layer disposed on one surface of the first insulating layer; a first wiring layer disposed on the one surface of the first insulating layer and having a pad; a first via passing through the first insulating layer and connected the pad; and a second insulating layer disposed on the first wiring layer and the protective filler layer, and having a cavity exposing the pad and at least a portion of the protective filler layer, respectively. The first insulating layer and the second insulating layer are separated from each other by the protective filler layer and the first wiring layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
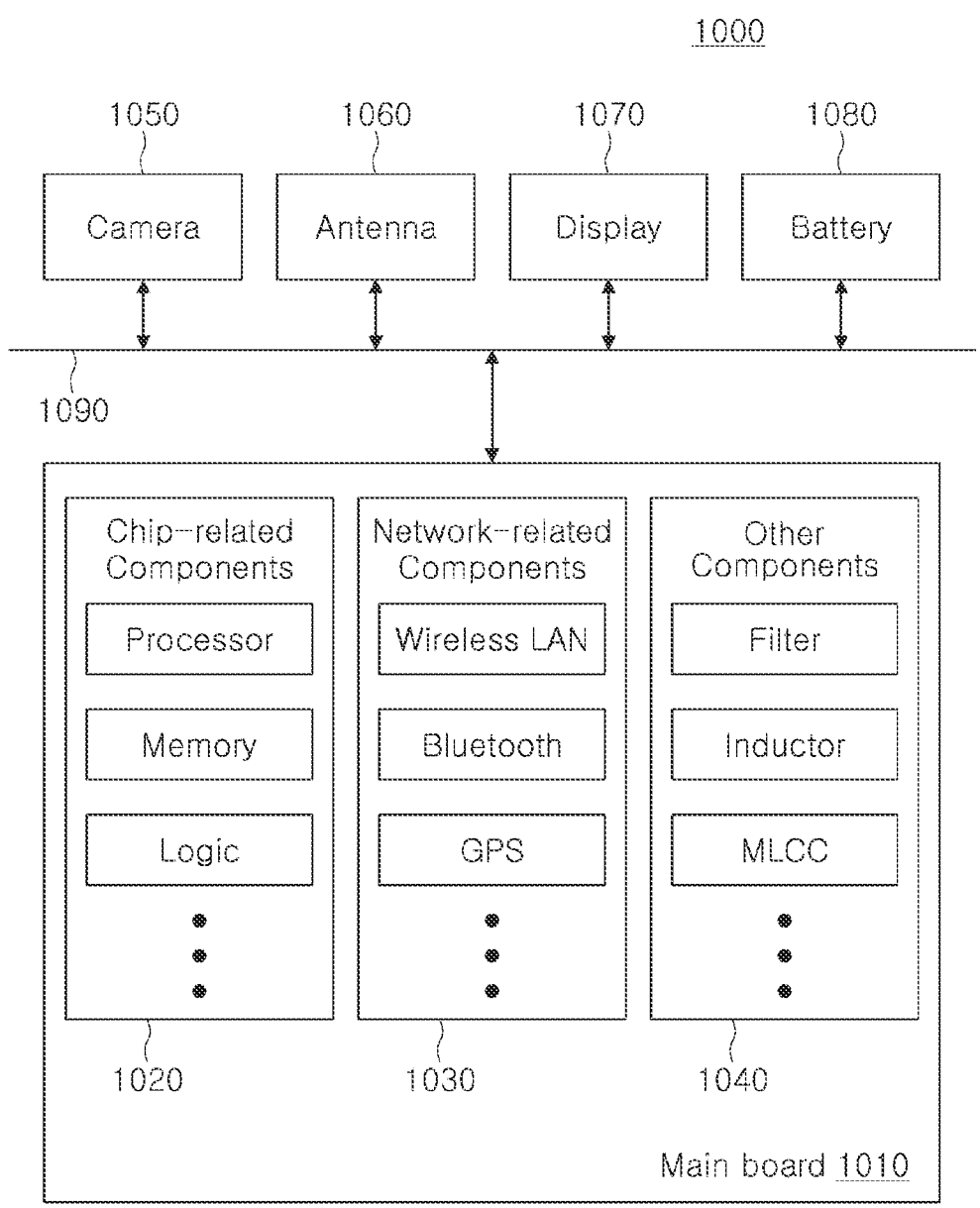
FIG. 1 is a view schematically illustrating an example of an electronic device system.

Hereinafter, the present disclosure will be described with reference to the accompanying drawings. Shapes, sizes, and the like of the elements in the drawings may be exaggerated or reduced for more clear description.

In addition, in assigning reference numbers to elements of the accompanying drawings, like reference numerals will denote like elements as possible, even though they are indicated in different drawings.

Moreover, in describing the present disclosure, if it is determined that the detailed description of the related well-known technology may unnecessarily obscure the gist of the present disclosure, the detailed description thereof will be omitted.

Electronic Device

FIG. 1 is a block diagram schematically illustrating an example of an electronic device system.

Referring to the drawing, an electronic device 1000 may accommodate a main board 1010 therein. The main board 1010 may include chip related components 1020, network related components 1030, other components 1040, and the like, physically and/or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip related components 1020 are not limited thereto, but may also include other types of chip related components. In addition, the chip related components 1020 may be combined with each other. The chip related component 1020 may be in the form of a package including the above-described chip or an electronic component.

The network related components 1030 may include components compatible with or communicating using various protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include components compatible with or communicating using a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 and/or the network related components 1030 described above.

Depending on a type of the electronic device 1000, the electronic device 1000 may include other components that may or may not be physically and/or electrically connected to the main board 1010. These other components may include, for example, a camera module 1050, an antenna module 1060, a display device 1070, a battery 1080, or the like. However, these other components are not limited thereto, but may also include an audio codec, a video codec, a power amplifier, a compass, an accelerometer, a gyroscope, a speaker, amass storage unit (for example, a hard disk drive), a compact disk (CD) drive, a digital versatile disk (DVD) drive, or the like. These other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
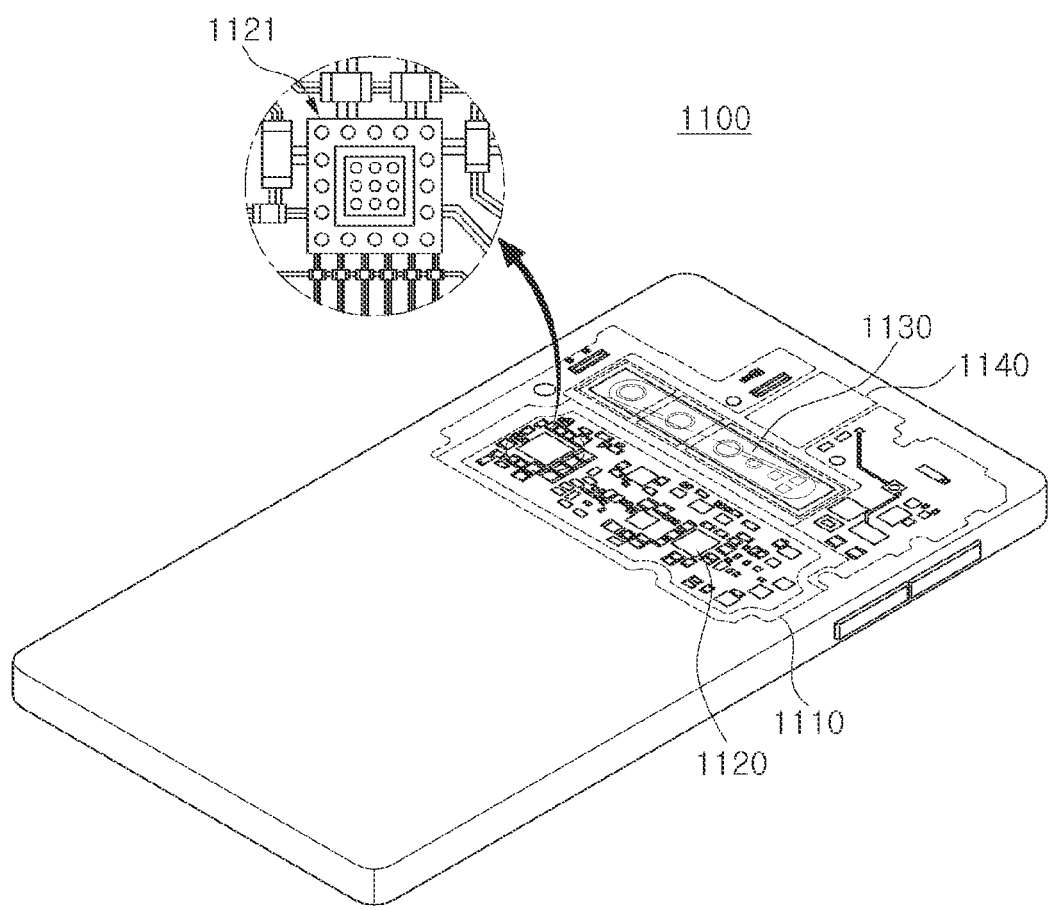
FIG. 2 is a view schematically illustrating an example of an electronic device.

FIG. 2 is a perspective view schematically illustrating an example of an electronic device.

Referring to the drawing, an electronic device may be, for example, a smartphone 1100. A main board 1110 may be accommodated in the smartphone 1100, and various electronic components 1120 may be physically and/or electrically connected to the main board 1110. In addition, other electronic components, such as a camera module 1130 and/or a speaker 1140, which may or may not be physically and/or electrically connected to the main board 1110 may be accommodated therein. A portion of the electronic components 1120 may be the above-described chip related components, for example, an antenna module 1121, but are not limited thereto. The antenna module 1121 may be provided as a surface-mounted form in which a semiconductor chip or a passive component is mounted on a printed circuit board, but is not limited thereto. The electronic device is not necessarily limited to the smartphone 1100, but may be other electronic devices as described above.

Structure and Manufacturing Method of Printed Circuit Board

Figure 3:
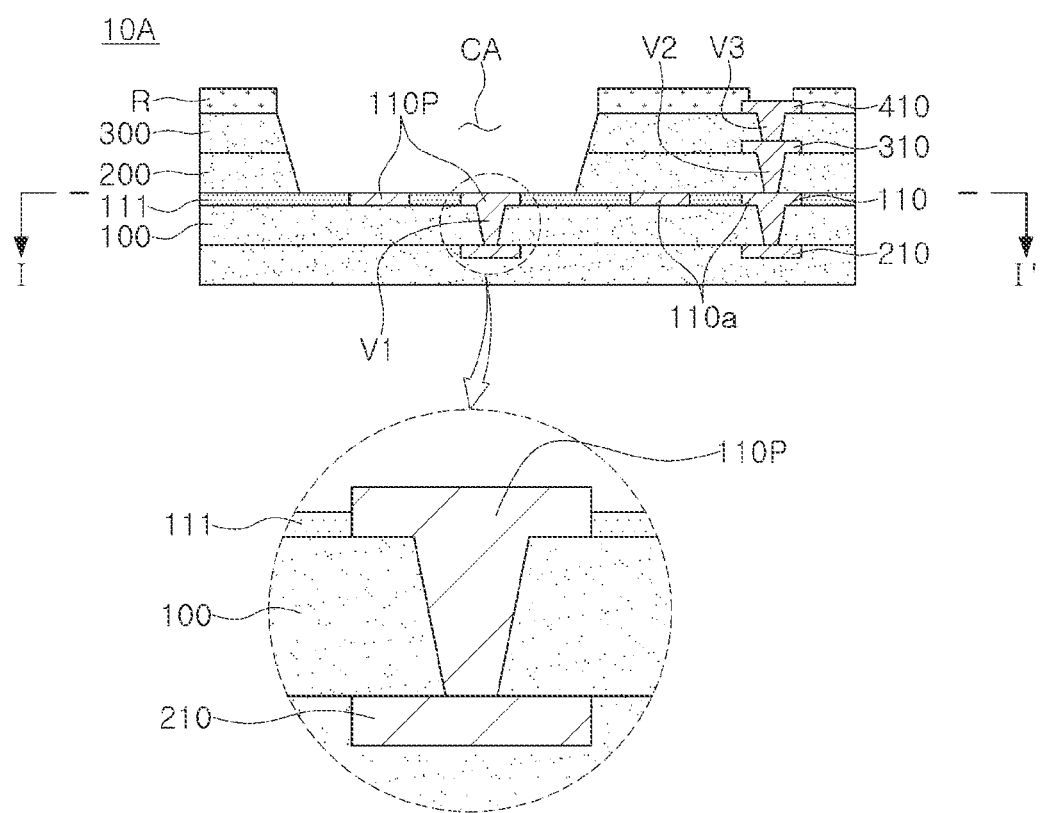
FIG. 3 is a view schematically illustrating an example of a printed circuit board according to the present disclosure.

FIG. 3 is a view schematically illustrating an example of a printed circuit board according to the present disclosure.

Referring to the drawing, a printed circuit board 10A may include a first insulating layer 100, a protective filler layer 111 disposed on one surface of the first insulating layer 100, a first wiring layer 110 disposed on the one surface of the first insulating layer 110 and having a pad 110P protruding from the protective filler layer 111, a first via V1 passing through the first insulating layer 100 and contacting the pad 110P, and a second insulating layer 200 disposed on the protective filler layer 111 disposed on the first wiring layer 110 and the protective filler layer 111 and having a cavity CA exposing the pad 110P and at least a portion of the protective filler layer 111, respectively.

In this case, the first wiring layer 110 or the protective filler layer 111 may be formed to protrude from the first insulating layer 100, and a thickness of the protective filler layer 111 may be less than a thickness of the pad 110P of the first wiring layer 110. For example, a level of an upper surface of the protective filler layer 111 may be lower than a level of an upper surface of the pad 110P, but is not limited thereto.

In addition, an upper surface and a side surface of the pad 110P of the first wiring layer 110 may be exposed through a bottom surface of the cavity CA of the second insulating layer 200. In this case, only a portion of the side surface of the pad 110P may be exposed through the bottom surface of the cavity CA. The exposed upper surface of the pad 110P may be connected to an electronic component.

In addition, the protective filler layer 111 and the pad 110P of the first wiring layer 110 may be in contact with the one surface of the first insulating layer 100, respectively. For example, a lower surface of the protective filler layer 111 may be coplanar with a lower surface of the pad 110P of the first wiring layer 110.

The protective filler layer 111 may be formed on the same layer, as those for the first wiring layer 110. For example, the protective filler layer 111 may be formed to contact the first insulating layer 100. In addition, the protective filler layer 111 may be formed between the first and second insulating layers 100 and 200. Therefore, the first insulating layer 100 and the second insulating layer 200 may be arranged to be spaced apart from each other.

The protective filler layer 111 may include an insulating material, and may include a material having less workability than the second insulating layer 200. In this case, the protective filler layer 111 may include an insulating material in a liquid form, and may be disposed on the first insulating layer 100 in a film form.

The protective filler layer 111 may be formed to be thinner than the pad 110P of the first wiring layer, and may include Ajinomoto build-up film (ABF) or a copper foil coating resin (RCC) having a high resin content, but is not limited thereto.

In this case, the protective filler layer 111 may include a material having a smaller modulus or a higher elongation than the second insulating layer 200. Therefore, when forming the cavity CA in the second insulating layer 200, the protective filler layer 111 may serve as a barrier. Therefore, a wear amount of the pad 110P of the first wiring layer may be reduced, and the pad 110P may have uniform roughness.

Referring to an enlarged view of FIG. 3, the protective filler layer 111 may be formed to be thinner than the pad 110P of the first wiring layer 110. Therefore, the upper surface and the side surface of the pad 110P may be exposed by the cavity CA of the second insulating layer 200. In particular, only a portion of the side surface of the pad 110P may be exposed, and the other portion of the side surface of the pad 110P may be in contact with the protective filler layer 111.

Also, the pad 110P of the first wiring layer may be in direct contact with and connected to the first via V1 passing through the first insulating layer 100. For example, the pad 110P of the first wiring layer, having only a single layer, may be formed to protrude from the first insulating layer 100, and the pad 110P protruding from the first insulating layer may be electrically connected to the first via V1.

In this case, the first via V1 may be disposed to be spaced apart from the protective filler layer 111. For example, a via for electrical connection may not be formed in the protective filler layer 111.

The first wiring layer 110 may further have a circuit pattern 110a. The circuit pattern may 110a include the same material as the pad 110P of the first wiring layer 110, and may be formed by the same process, but is not limited thereto.

The second insulating layer 200 may be formed to contact the circuit pattern 110a and the protective filler layer 111 of the first wiring layer 110, respectively, and may cover only a portion of a side surface of the circuit pattern 110a.

The circuit pattern 110a of the first wiring layer 110 may not be exposed by the cavity CA of the second insulating layer 200, and may be formed to be buried by the second insulating layer 200.

For example, the side surface of the circuit pattern 110a of the first wiring layer 110 may be completely covered with the second insulating layer 200 and the protective filler layer 111.

In addition, the printed circuit board 10A may further include a second wiring layer 210 disposed on the other surface of the first insulating layer 100 opposing the one surface of the first insulating layer 100 and connected to the first wiring layer 110 through the first via V1.

In addition, the second wiring layer 210 may be formed to protrude from the first insulating layer 100. In this case, the first via V1 may have a tapered shape in a direction of the second wiring layer 210. For example, the first via V1 may have a shape that may be narrowed in a direction from the first wiring layer 110 to the second wiring layer 210.

Also, the first via V1 may be completely filled with a metal material, or the metal material may be formed along a wall surface of the via hole. The first via V1 may be formed by a plating process, for example, AP, SAP, MSAP, TT, etc. As a result, the first via V1 may include a seed layer that may be an electroless plating layer and an electrolytic plating layer formed based on the seed layer. As necessary, a primer copper foil may be further included, but is not limited thereto.

In addition, the printed circuit board 10A may further include a third wiring layer 310 disposed on one surface of the second insulating layer 200, a second via V2 passing through the second insulating layer 200 and connecting the first and third wiring layers 110 and 310, a third insulating layer 300 disposed on the one surface of the second insulating layer 200 and embedding the third wiring layer 310, a fourth wiring layer 410 disposed on one surface of the third insulating layer 300, and a third via V3 connecting the third and fourth wiring layers 310 and 410. In this case, the cavity CA disposed in the second insulating layer 200 may extend into the third insulating layer 300.

In addition, the printed circuit board 10A may further include a solder resist layer R disposed on the one surface of the third insulating layer 300 and extending the cavity CA.

Also, an opening may be formed in the solder resist layer R to expose a portion of the fourth wiring layer 410 externally.

A width such as a diameter of the cavity CA in the third insulating layer 300 may be larger than a width such as a diameter of the cavity CA in the second insulating layer 200. In particular, a step difference may be formed in the second and third insulating layers 200 and 300 by the cavity CA.

In addition, the first and second vias V1 and V2 disposed in the printed circuit board 10A may be arranged to be spaced apart from the protective filler layer 111, respectively. For example, the first and second vias V1 and V2 may not be formed in or connected to the protective filler layer 111.

The first to third insulating layers 100, 200, and 300 may include the same material or different materials. In addition, the first to third insulating layers 100, 200, and 300 may include a thermosetting resin, but are not limited thereto.

A material for forming the first to third insulating layers 100, 200, and 300 is not particularly limited. For example, known materials such as prepreg (PPG), Ajinomoto build-up film (ABF), polyimide, epoxy, a copper foil coating resin (RCC), a liquid crystal polymer (LCP), or the like may be used.

The second and third insulating layers 200 and 300 may include a material having higher workability than the protective filler layer 111. In particular, the protective filler layer 111 may include a material having a smaller modulus or a higher elongation rate than the second and third insulating layers 200 and 300.

From this, during processing the cavity CA of the second and third insulating layers 200 and 300, the protective filler layer 111 may not be processed, a wear amount of the pad 110P of the first wiring layer 110 may be reduced, and a processing time period may be shortened. In addition, the protective filler layer 111 may serve as a barrier to provide a printed circuit board having uniform surface roughness.

The first to fourth wiring layers 110, 210, 310, and 410 may be formed through a plating process. For example, the first to fourth wiring layers 110, 210, 310, and 410 may be formed by an additive process (AP), a semi-additive process (SAP), or a modified semi-additive process (MSAP). As another example, the first to fourth wiring layers 110, 210, 310, and 410 may be formed by a subtractive process such as tenting, or the like, but is not limited thereto.

In addition, a conductive material may be used as a material for forming the first to fourth wiring layers 110, 210, 310, and 410. For example, a conductive material such as copper (Cu), aluminum (Al), silver (Ag), gold (Au), nickel (Ni), lead (Pb), titanium (Ti), tin (Sn), palladium (Pd), alloys thereof, or the like may be used, but is not limited thereto.

In addition, the second and third vias V2 and V3 may be completely filled with a metal material, or the metal material may be formed along a wall surface of the via hole. The first to third vias V1, V2, and V3 may be formed by a plating process, for example, AP, SAP, MSAP, TT, or the like. As a result, the first to third vias V1, V2, and V3 may include a seed layer that may be an electroless plating layer and an electrolytic plating layer formed based on the seed layer. As necessary, a primer copper foil may be further included, but is not limited thereto.

In addition, the solder resist layer R may be made of a photosensitive material. In addition, the solder resist layer R may have thermosetting and/or photocuring properties, but is not limited thereto.

Since other descriptions may be applied in substantially the same manner as those described above, detailed descriptions thereof will be omitted.

Figure 4:
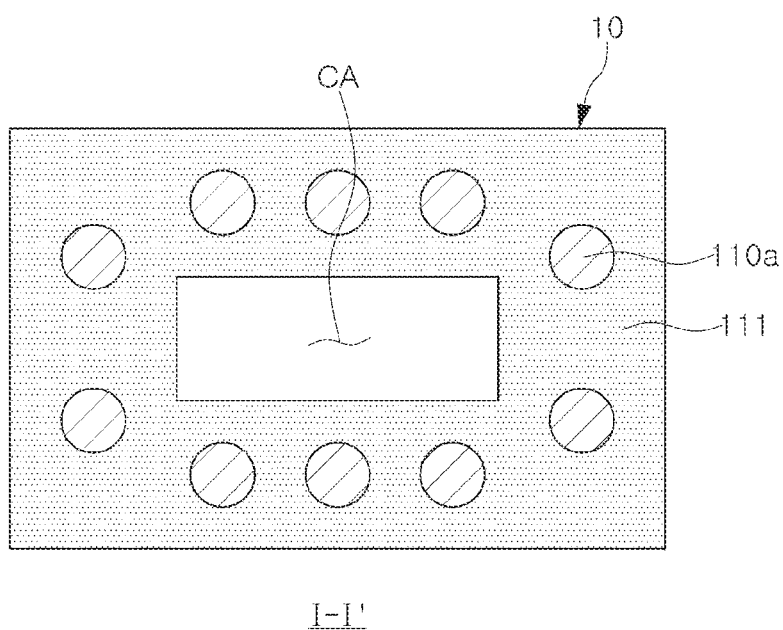
FIG. 4 is a view schematically illustrating a top view of the printed circuit board of FIG. 3, taken along line I-I'.

FIG. 4 is a view schematically illustrating a top view of the printed circuit board of FIG. 3, taken along line I-I'.

One surface of the first insulating layer 100 of the printed circuit board 10A may be covered with the protective filler layer 111. In this case, the first wiring layer 110 may be disposed on the one surface of the first insulating layer 100, and the first wiring layer 110 may have the pad 110P and the circuit pattern 110a.

The second insulating layer 200 covering the protective filler layer 111 may be disposed, and the cavity CA exposing the pad 110P of the first wiring layer may be formed in the second insulating layer 200.

The circuit pattern 110a may be a portion of the first wiring layer 110 from which the pad 110P exposed by the cavity CA is excluded. The circuit pattern 110a may be completely buried by the second insulating layer 200.

An electronic component may be additionally mounted on the cavity CA.

Since other descriptions may be applied in substantially the same manner as those described above, detailed descriptions thereof will be omitted.

Figure 5:
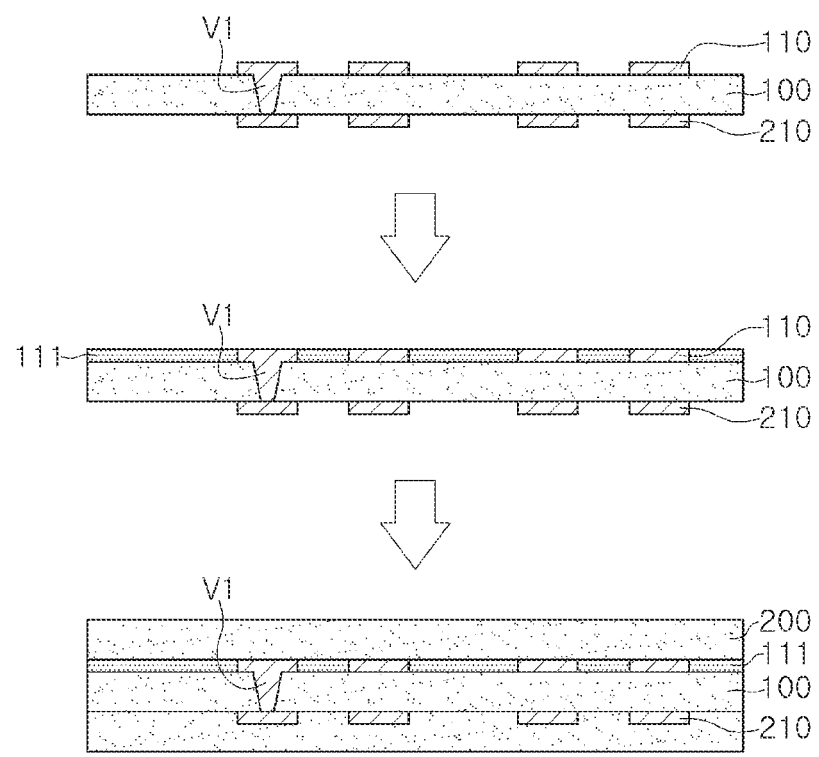
FIG. 5 is a view schematically illustrating a process of manufacturing a printed circuit board according to the present disclosure.

FIG. 5 is a view schematically illustrating a process of manufacturing a printed circuit board according to the present disclosure.

First, a first wiring layer 110 and a second wiring layer 210 may be arranged on one surface of a first insulating layer 100 and the other surface of the first insulating layer 100 opposing the one surface, respectively. In this case, a first via V1 having a tapered shape in a direction toward the second wiring layer 210 and connecting the first and second wiring layers 110 and 210 may be additionally formed.

Next, a protective filler layer 111 may be formed on one surface of the first insulating layer 100. The protective filler layer 111 may be formed to contact the one surface of the first insulating layer 100, and may be formed to be spaced apart from the first via V1. In particular, the first wiring layer 110 may be formed to protrude from the protective filler layer 111. For example, a thickness of the protective filler layer 111 may be formed to be thinner than a thickness of the first wiring layer 110, and a level of an upper surface of the first wiring layer 110 may be higher than a level of an upper surface of the protective filler layer 111.

Then, a second insulating layer 200 may be disposed on one surface of the protective filler layer 111. The second insulating layer 200 may be formed to be spaced apart from the first insulating layer 100. For example, the first and second insulating layers may not be in contact with each other. In addition, the second insulating layer may embed the first wiring layer 110.

The protective filler layer 111 may include an insulating material, and may include a material having lower workability than the second insulating layer 200. The protective filler layer 111 may include a material having a smaller modulus or a higher elongation rate than the second insulating layer 200. In this case, the protective filler layer 111 may include an insulating material in a liquid form, and may be disposed on the first insulating layer 100 in a film form.

An insulating layer embedding the second wiring layer 210 may also be disposed on the other surface of the first insulating layer 100.

Since other descriptions may be applied in substantially the same manner as those described above, detailed descriptions thereof will be omitted.

Figure 6A:
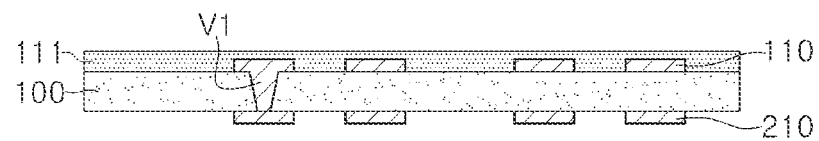
FIG. 6A to 6C are views schematically illustrating an example of a printed circuit board according to the present disclosure.
Figure 6B:
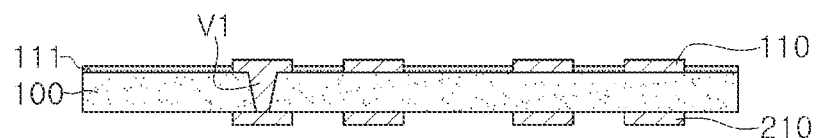
Figure 6C:
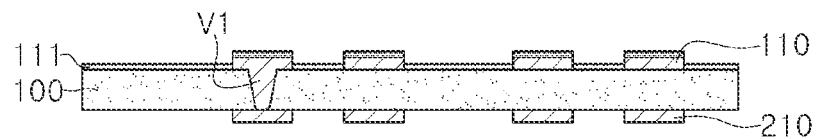

FIG. 6A to 6C are views schematically illustrating an example of a printed circuit board according to the present disclosure.

As in the process illustrated in FIG. 5, a protective filler layer 111 may be disposed on one surface of a first insulating layer 100. As a material of the protective filler layer 111, an insulating material in a liquid form may be applied to the first insulating layer 100. Alternatively, a film having low viscosity may be used to cover the first insulating layer 100 and a first wiring layer 110.

In this case, as illustrated in FIG. 6A, a thickness of a protective filler layer 111 may be thicker than a thickness of a first wiring layer 110. For example, the protective filler layer 111 may embed the first wiring layer.

Also, referring to FIGS. 6B and 6C, a protective filler layer 111 may be formed to have a thickness smaller than a thickness of a first wiring layer 110. For example, the first wiring layer 110 may be formed to protrude from the protective filler layer 111.

In this case, as the material of the protective filler layer 111, an insulating material may be used in a liquid form or a film form. When the insulating material in a liquid form is used, the protective filler layer 111 may be formed only on one surface of the first insulating layer 100, and the protective filler layer 111 may not be formed on one surface of the first wiring layer 110, as illustrated in FIG. 6B.

When the insulating material in a film form is used, the protective filler layer 111 may finely cover one surface of the first wiring layer 110, as illustrated in FIG. 6C.

Since other descriptions may be applied in substantially the same manner as those described above, detailed descriptions thereof will be omitted.

Figure 7:
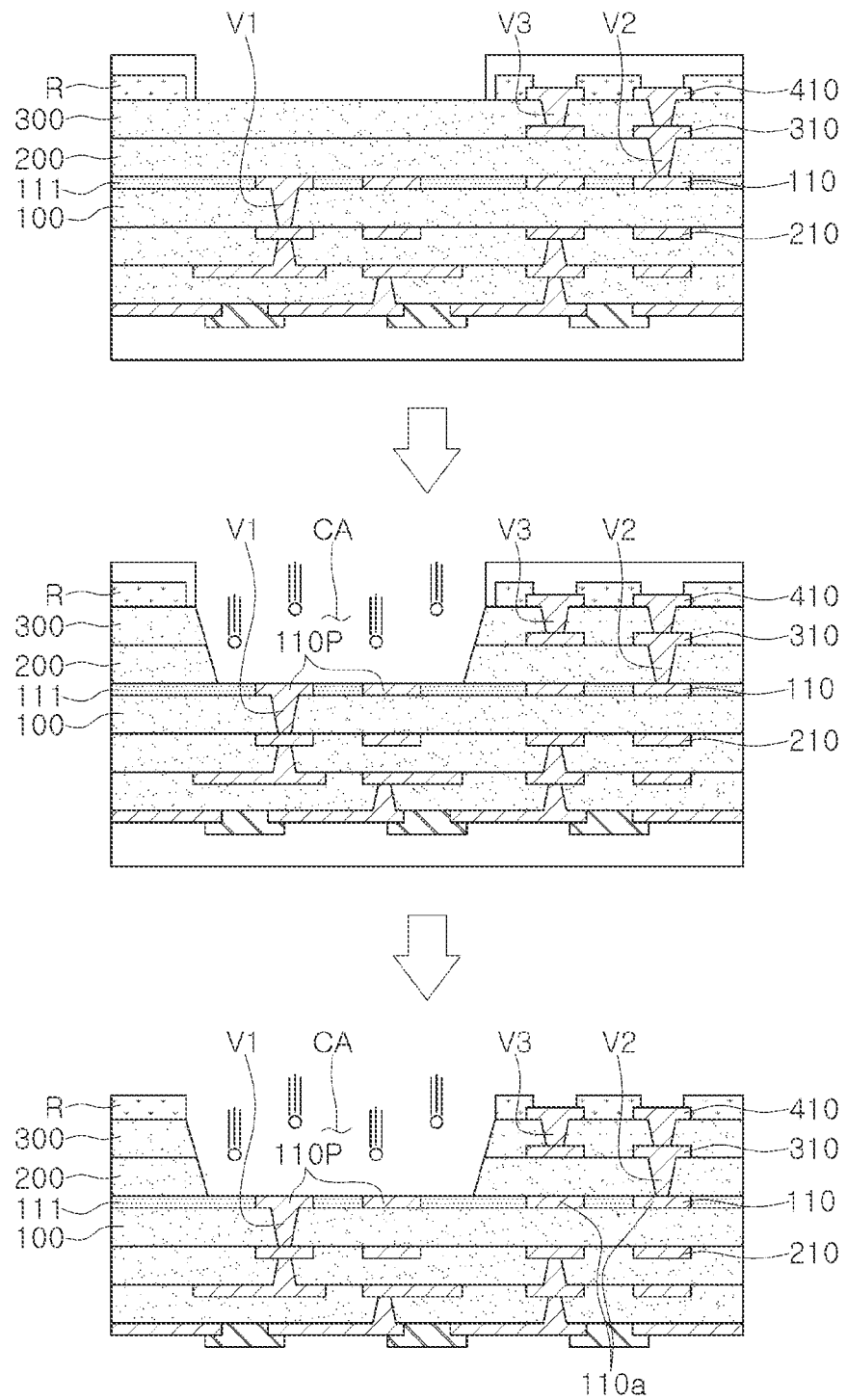
FIG. 7 is a view schematically illustrating a process of manufacturing a printed circuit board according to the present disclosure.

FIG. 7 is a view schematically illustrating a process of manufacturing a printed circuit board according to the present disclosure.

A printed circuit board according to the present disclosure may be manufactured by forming a plurality of insulating layers and wiring layers on the first insulating layer 100 and the first and second wiring layers 110 and 210, prepared in any one of FIGS. 6A to 6C.

First, first to third insulating layers 100, 200, and 300, first to fourth wiring layers 110, 210, 310, and 410, and a solder resist layer R may be formed, and a protective layer may be disposed on an outermost side.

The protective layer may be formed, except for a position in which a cavity CA is formed, and may include a material having lower workability than the second and third insulating layers, but is not limited thereto.

Thereafter, a process of forming the cavity CA may be performed. In this case, the cavity CA may be formed by a blasting process, but is not limited thereto.

When the blasting process for forming the cavity CA is performed, a protective filler layer 111 disposed on one surface of the first insulating layer 100 may serve as a mask pattern or a barrier.

Therefore, positional accuracy in forming the cavity CA may be improved, and a size thereof may also be formed with improved accuracy. In addition, a wear amount of a pad 110P of the first wiring layer exposed by the formation of the cavity CA may be reduced, and a processing time period of the cavity CA may be shortened. The pad 110P may be formed to have uniform roughness.

When the pad 110P of the first wiring layer 110 is exposed by forming the cavity CA, the protective layer disposed on the outermost side may be removed.

Since other descriptions may be applied in substantially the same manner as those described above, detailed descriptions thereof will be omitted.

Figure 8:
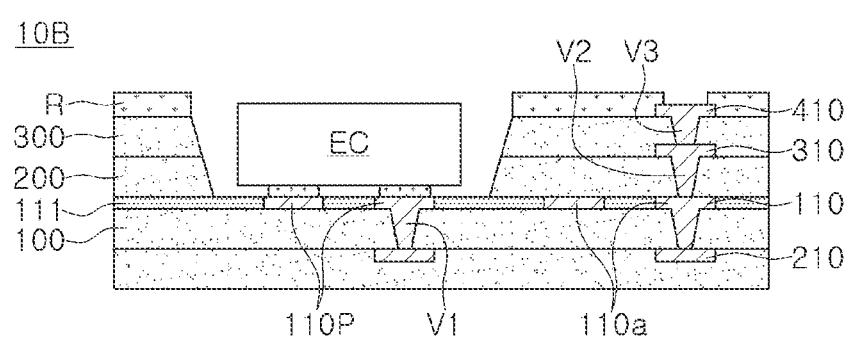
FIG. 8 is a view schematically illustrating an example in which an electronic component is mounted on a printed circuit board according to the present disclosure.

FIG. 8 is a view schematically illustrating an example in which an electronic component is mounted on a printed circuit board according to the present disclosure.

Referring to the drawing, in a printed circuit board 10B, an electronic component EC may be disposed in a cavity CA of second and third insulating layers 200 and 300, and may be connected to an exposed pad 110P of a first wiring layer 110.

The electronic component EC may be connected to the pad 110P through a connection conductor. The connection conductor may be a solder ball, but is not limited thereto, and a conductive material may be used without limitation.

In addition, the electronic component EC may be an active component, specifically, a plurality of dies. The plurality of dies may be connected to each other to implement an application processor. The electronic component EC is not limited thereto, and may be a passive component such as a capacitor, an inductor, or the like.

Since other descriptions may be applied in substantially the same manner as those described above, detailed descriptions thereof will be omitted.

An expression stating "one component is disposed on the other component" in the present specification may not be intended to establish a direction. Therefore, the expression stating "one component is disposed on the other component" may refer that the one component may be disposed on an upper side of the other component or may be disposed on a lower side of the other component.

In the present specification, terms such as upper surface, a lower surface, an upper side, a lower side, an uppermost side, a lowermost side, or the like may refer to a direction to be set based on the drawings for convenience of description. Therefore, depending on a direction to be set, the upper surface, the lower surface, the upper side, the lower side, the uppermost side, the lowermost side, or the like may be described as different terms.

As used herein, the term "connect" or "connection" in the present specification may not be only a direct connection, but also a concept including an indirect connection. In addition, the term "electrically connected" or "electrical connection" in the present specification is a concept including both a physical connection and a physical non-connection.

In the present specification, the expressions of "first," second," etc. in the present specification are used to distinguish one component from another, and do not limit the order and/or importance of the components. In some cases, without departing from the spirit of the present disclosure, a "first" component may be referred to as a "second" component, and similarly, a "second" component may be referred to as a "first" component.

The expression "example" used in this specification does not refer to the same embodiment to each other, but may be provided for emphasizing and explaining different unique features. However, the above-mentioned examples do not exclude that the above-mentioned examples are implemented in combination with the features of other examples. For example, although the description in a specific example is not described in another example, it can be understood as an explanation related to another example, unless otherwise described or contradicted by the other example.

The terms used in the present disclosure are used only to illustrate various examples and are not intended to limit the present inventive concept. Singular expressions include plural expressions unless the context clearly dictates otherwise.

A printed circuit board and a manufacturing process of the printed circuit board according to the present disclosure are not limited thereto, and modifications and variations could be made without departing from the spirit and scope of the present disclosure by those skilled in the art.

As one effect among various effects of the present disclosure, a printed circuit board including a microcircuit and/or a micro via may be provided.

As another effect among various effects of the present disclosure, a printed circuit board having improved uniformity of a microcircuit may be provided.

While example embodiments have been illustrated and described above, it will be apparent to those skilled in the art that modifications and variations could be made without departing from the scope of the present disclosure as defined by the appended claims.

What is claimed is:

1. A printed circuit board comprising:
a first insulating layer;
a protective filler layer disposed on one surface of the first insulating layer;
a first wiring layer disposed on the one surface of the first insulating layer and having a pad protruding with respect to the protective filler layer, such that the protective filler layer covers at least a portion of a side surface of the first wiring layer;
a first via passing through the first insulating layer and contacting the pad; and
a second insulating layer disposed on the first wiring layer and the protective filler layer, and having a cavity exposing the pad and at least a portion of the protective filler layer, respectively.

2. The printed circuit board of claim 1, wherein an upper surface and a side surface of the pad of the first wiring layer are exposed through a bottom surface of the cavity.

3. The printed circuit board of claim 1, wherein the protective filler layer and the pad of the first wiring layer are in contact with the one surface of the first insulating layer, respectively.

4. The printed circuit board of claim 1, wherein the first insulating layer and the second insulating layer are disposed to be spaced apart from each other.

5. The printed circuit board of claim 1, wherein the first wiring layer further has a circuit pattern, and
the second insulating layer is in contact with each of the protective filler layer and the circuit pattern, and covers at least a portion of a side surface of the circuit pattern.

6. The printed circuit board of claim 1, wherein a modulus of the protective filler layer is lower than a modulus of the second insulating layer.

7. The printed circuit board of claim 1, further comprising a second wiring layer disposed on the other surface of the first insulating layer opposing the one surface of the first insulating layer and connected to the first wiring layer through the first via.

8. The printed circuit board of claim 7, wherein the first via has a tapered shape in a direction toward the second wiring layer.

9. The printed circuit board of claim 1, further comprising:
- a third wiring layer disposed on one surface of the second insulating layer;
- a second via passing through the second insulating layer and connecting the first and third wiring layers;
- a third insulating layer disposed on the one surface of the second insulating layer and covering the third wiring layer;
- a fourth wiring layer disposed on one surface of the third insulating layer; and
- a third via connecting the third and fourth wiring layers, wherein the cavity extends into the third insulating layer.

10. The printed circuit board of claim 9, further comprising a solder resist layer disposed on the one surface of the third insulating layer,
wherein the cavity extends into the solder resist layer.

11. The printed circuit board of claim 9, wherein a width of the cavity in the third insulating layer is larger than a width of the cavity in the second insulating layer.

12. The printed circuit board of claim 9, wherein the first and second vias are arranged to be spaced apart from the protective filler layer, respectively.

13. The printed circuit board of claim 1, further comprising an electronic component disposed in the cavity and connected to the pad of the first wiring layer.

14. A printed circuit board comprising:
- a first insulating layer;
- a protective filler layer disposed on one surface of the first insulating layer;
- a first wiring layer disposed on the one surface of the first insulating layer and having a pad, such that the protective filler layer covers at least a portion of a side surface of the first wiring layer;
- a first via passing through the first insulating layer and connected to the pad; and
- a second insulating layer disposed on the first wiring layer and the protective filler layer, and having a cavity exposing the pad and at least a portion of the protective filler layer, respectively,
wherein the first insulating layer and the second insulating layer are separated from each other by the protective filler layer and the first wiring layer.

15. The printed circuit board of claim 14, wherein the protective filler layer and the pad of the first wiring layer are in contact with the one surface of the first insulating layer, respectively.

16. The printed circuit board of claim 14, wherein the first wiring layer further has a circuit pattern, and
the second insulating layer is in contact with each of the protective filler layer and the circuit pattern, and covers at least a portion of a side surface of the circuit pattern.

17. The printed circuit board of claim 14, wherein a modulus of the protective filler layer is lower than a modulus of the second insulating layer.

18. The printed circuit board of claim 14, further comprising a second wiring layer disposed on the other surface of the first insulating layer opposing the one surface of the first insulating layer and connected to the first wiring layer through the first via.

19. The printed circuit board of claim 18, wherein the first via has a tapered shape in a direction toward the second wiring layer.

20. The printed circuit board of claim 14, further comprising an electronic component disposed in the cavity and connected to the pad of the first wiring layer.

* * * * *